(12) United States Patent
Ivansen et al.

(10) Patent No.: US 9,275,442 B2
(45) Date of Patent: Mar. 1, 2016

(54) GRADIENT ASSISTED IMAGE RESAMPLING IN MICRO-LITHOGRAPHIC PRINTING

(71) Applicant: Mycronic AB, Täby (SE)

(72) Inventors: Lars Ivansen, Solna (SE); Anders Osterberg, Taby (SE)

(73) Assignee: Mycronic AB, Taby (SE)

( * ) Notice: Subject to any disclaimer, the term of this patent is extended or adjusted under 35 U.S.C. 154(b) by 0 days.

(21) Appl. No.: 14/536,467

(22) Filed: Nov. 7, 2014

(65) Prior Publication Data
US 2015/0125077 A1    May 7, 2015

Related U.S. Application Data

(63) Continuation of application No. 12/631,595, filed on Dec. 4, 2009, now abandoned.

(60) Provisional application No. 61/200,967, filed on Dec. 5, 2008.

(51) Int. Cl.
*G06K 9/40* (2006.01)
*G06T 5/00* (2006.01)
*G03F 7/20* (2006.01)

(52) U.S. Cl.
CPC ............ *G06T 5/006* (2013.01); *G03F 7/70291* (2013.01); *G03F 7/70508* (2013.01)

(58) Field of Classification Search
None
See application file for complete search history.

(56) References Cited

U.S. PATENT DOCUMENTS

| | | | | |
|---|---|---|---|---|
| 5,115,477 A * | 5/1992 | Groezinger | ........... | G06T 7/0083 382/199 |
| 5,533,170 A * | 7/1996 | Teitzel | ................... | G03F 7/704 345/502 |
| 5,673,376 A * | 9/1997 | Ray | ........................... | G06T 3/40 345/427 |
| 5,754,618 A * | 5/1998 | Okamoto | .................. | G06T 5/20 378/4 |
| 5,774,573 A * | 6/1998 | Caspi | ...................... | G06T 3/403 382/141 |
| 7,328,425 B2 * | 2/2008 | Olsson | ................ | G03F 7/70291 250/370.1 |
| 2002/0135592 A1* | 9/2002 | Slavin | .................. | G06T 3/4007 345/589 |
| 2002/0136446 A1* | 9/2002 | Slavin | .................. | G06T 11/001 382/162 |
| 2003/0038811 A1* | 2/2003 | Gritz | .................. | G06F 17/3028 345/581 |
| 2003/0107770 A1 | 6/2003 | Klatchko et al. | | |

OTHER PUBLICATIONS

Japanese Office Action, 2011-539038, dated Nov. 25, 2014, 4 pages.
Hellgren, Jonas et al, Reducing process contributions to CD error range using the Sigma7500 pattern generator and ProcessEqualizeTM, Photomask and Next-Generation Lithography Mask Technology XIII, Proc. of SPIE vol. 6283, 628311, (2006)—0277-786/06/$15—doi: 10.1117/12.681743, 11 pages.
Japanese Application, English Abstract from espacenet, Graphics Engine for High Precision Lithography, Japanese Application in Japanese, 2005-52909 A, Jan. 27, 2005, 2 pages.

* cited by examiner

*Primary Examiner* — Jayesh A Patel
(74) *Attorney, Agent, or Firm* — Haynes Beffel & Wolfeld LLP

(57) ABSTRACT

The present disclosure relates to the re-sampling of pixel data, with one application being micro-lithography. In particular, it relates to a first pixel map, including a plurality of white, black and grey scale pixels and gradient directions for one or more of the grey scale pixels, that is resampled to produce a second pixel map using edge geometry data generated from the gradient directions and grey scale values.

16 Claims, 7 Drawing Sheets

GRADIENT ASSISTED IMAGE RESAMPLING IN MICRO-LITHOGRAPHIC PRINTING

PRIORITY

This application is a continuation of U.S. patent application Ser. No. 12/631,595, titled "GRADIENT ASSISTED IMAGE RESAMPLING IN MICRO-LITHOGRAPHIC PRINTING", filed 4 Dec. 2009, now abandoned, which claimed the benefit of U.S. Patent Provisional Application No. 61/200,967, titled "GRADIENT ASSISTED RESAMPLING IN MICRO-LITHOGRAPHIC PRINTING" filed 5 Dec. 2008. The provisional application is incorporated by reference.

INCORPORATIONS

This application is related to U.S. patent application Ser. No. 09/954,721, entitled "GRAPHICS ENGINE FOR HIGH PRECISION LITHOGRAPHY", filed 12 Sep. 2001, which issued as U.S. Pat. No. 7,302,111 on 27 Nov. 2007; and to U.S. patent application Ser. No. 11/736,490, entitled "TRIANGULATING DESIGN DATA AND ENCODING DESIGN INTENT FOR MICROLITOHGRAPHIC PRINTING", filed 17 Apr. 2007, which issued as U.S. Pat. No. 7,930,653 on 19 Apr. 2011; and to U.S. patent application Ser. No. 12/626,581 entitled "IMAGE READING AND WRITING USING A COMPLEX TWO-DIMENSIONAL INTERLACE SCHEME", filed 25 Nov. 2009, which issued as U.S. Pat. No. 8,351,020 on 8 Jan. 2013; and to U.S. patent application Ser. No. 12/631,653, filed 4 Dec. 2009, entitled "METHOD AND DEVICE USING ROTATING PRINTING ARM TO PROJECT OR VIEW IMAGE ACROSS A WORKPIECE", which issued as U.S. Pat. No. 8,442,302 on 14 May 2013. These related applications are incorporated by reference.

BACKGROUND OF THE INVENTION

The present disclosure relates to the re-sampling of pixel data, with one application being micro-lithography. In particular, it relates to the extraction of modulator pixels from a rasterized image, as a function of how the modulator moves across the rasterized image.

Micro-lithography is the process of writing a circuit design (so-called geometry) onto a workpiece having a radiation sensitive layer, typically either a photomask for use in exposing equipment or directly onto a wafer or substrate. The lithographic write equipment writes the geometry onto the workpiece, using a laser or charged beam to expose a resist layer. This exposure changes the molecular composition of the resist. During the developing process for a positive resist, any resist that has been exposed will be removed. In some applications, a negative resist is used where the resist that was not exposed will be removed in development.

Photomasks are high precision plates containing microscopic images of electronic circuits. Photomasks typically are made from very flat pieces of quartz or glass with a layer of chrome on one side. Etched in the chrome is a portion of an electronic circuit design. This circuit design on the mask is also sometimes called the geometry.

Photomasks are used in wafer fabrication, mostly to make ICs (integrated circuits). ICs are used in many products like computers, calculators, cars, cameras, and stereos. Photomasks are also used to make flat panel displays, thin film heads, PC boards, etc.

During development, a customer designs a circuit using tools that digitally store the information. The customer then sends the digitized data containing the design for each layer to the mask maker or direct writing vendor. The data can be sent on a disk, magnetic tape, via Internet or dedicated lines.

The mask maker takes the customer's data and formats it for the actual tools or systems in which the masks will be made. This includes fracturing the data, sizing the data if needed, rotating the data if needed, adding fiducials and internal reference marks, and making a jobdeck, which includes instructions for the placement of all the different patterns on the mask.

Fracturing the data means translating the customer data into a language the write tool can understand. The write system typically uses rectangles, trapezoids and/or triangles. The customer data is divided up (fractured) into these shapes. The jobdeck with the fractured data is put on a data media and sent to the write area or pulled directly to the machines using network software.

Before the pattern can be printed, additional pattern processing is needed. The geometries are spatially reorganized to match the writing sequence of the tool. For some systems, this means rendering the geometries into pixels to be imaged by the exposure system. For other systems, this means translating the geometries into a format appropriate for vector shaped beams (VSBs) or laser scanning.

For a pixel-based exposure system, the number of pixels to be printed is proportional to the area the pattern cover. Even though the number of pixels is constant, there may be a significant difference in computational resources needed to process the pattern. Resource demands are heavily dependent on pattern, thus complicating component sizing of the pattern processing system.

For applications where same pattern is printed several times, either on the same mask/substrate (multipass printing) or on separate masks/substrates, it is desired to not repeat the entire pattern processing for each print, even though the actual pattern printed could differ from piece-to-piece.

The technology disclosed usefully addresses the two problems above for pixel-based exposure systems by introducing a data processing architecture using a processor to produce an intermediate pixel, a so-called Geometrical Pixel Map (GPM) from which the actual printed pixels, the so-called Modulator Pixel Map (MPM) is derived.

The data processing architecture is henceforth referred to as the data path. The data path is the combination of execution units, data transportation, data storage, software, firmware and algorithms, organized to transform the designer's description of the image to be printed by modulator pixels of writer systems.

SUMMARY OF THE INVENTION

The present disclosure relates to the re-sampling of pixel data, with one application being micro-lithography. In particular, it relates to the extraction of modulator pixels from a rasterized image, as a function of how the modulator moves across the rasterized image.

DETAILED DESCRIPTION

Figure 1:
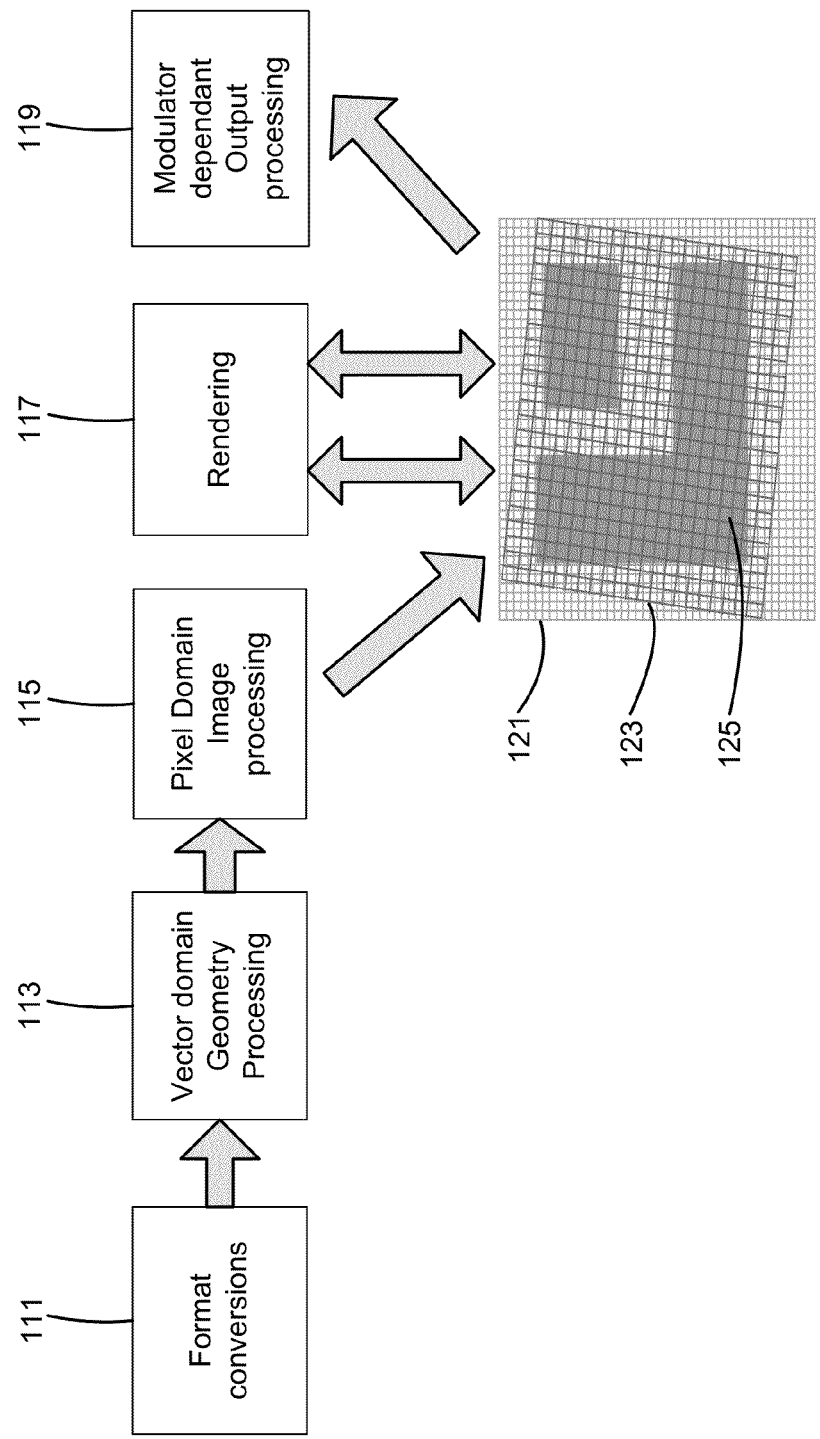
FIG. 1 The data is rendered to a pixel map that is reused for all passes and thereby reduces the field independent operations to one occurrence.

The following detailed description is made with reference to the figures. Preferred embodiments are described to illustrate the present invention, not to limit its scope, which is defined by the claims. Those of ordinary skill in the art will recognize a variety of equivalent variations on the description that follows.

The present disclosure relates to:

1. Gradient assisted image re-sampling
2. Individual adjustments of pattern image per printed substrate by re-sampling.
3. A data path architecture (FIG.1) where pattern dependent processing (111, 113, 115, 117) and modulator dependent processing (119) can be decoupled.

Data for a pixel-based exposure system that prints in a sequential manner needs to be "flat" (all data contributing to one pixel aggregated) and localized. The pattern (125) represented as a rendered geometrical pixel map (GPM 121) fulfils these properties and makes a suitable format as intermediate storage.

A re-sampling process converts the GPM into modulator pixels in a modulator pixel map (MPM 123). Image processing and morphological operations can also be applied to during this re-sampling process. It is possible to apply the image processing and morphological operations at both local parts of the pattern, such as over the exposure system field of view, or globally over the pattern. The image processing and morphological operations include, but are not limited to, scaling, translation, rotation, distortion and sizing. These operations can be used to compensate both for how the exposure system projects pixels onto the mask/substrate and for properties of the mask/substrate.

Due to fidelity requirements and the potential information loss during the re-sampling process, the intermediate pixel map (GPM 121) has a higher resolution than the Modulator Pixel Map (MPM 123). By using gradient 435 information in the re-sampling process, the memory resolution required to satisfy the requirement of the GPM 121 can be significantly reduced.

The majority of the pattern dependent processing steps are done during generation of the GPM 121. The re-sampling is primarily used to handle localized pattern dependent (morphological) operations. It is advantageous to limit re-sampling to localized pattern dependent operations, as this improves the predictability of computational effort for the re-sampling. Predictable computational effort, in turn, makes it easier to parallelize processing.

The use of the GPM 121 as intermediate storage enables exposure system independence, since processing steps to generate the GPM 121 can be made generic and independent from an exposure system.

Processing requirements for data paths in high resolution microlithography are very challenging, even using latest and most capable processing HW. A contributing factor to success in high resolution processing and in high performance computing (HPC), generally, is parallelization. Parallelizing high resolution processing involves dividing the processing into small pieces. Microlithography applications that use the data paths described process data that has a geographical property, which works within a coordinate system. One convenient way to divide the task is coordinate oriented.

Processing according to the architecture disclosed can be described in two domains, called off-line and on-line. Processing also operates in different data domains. In this disclosure, we refer to processing to create the geometrical pixel maps 121 as "GPM processing." We refer to resampling of the GPM to create the modulator pixel map 123 as "MPM processing." In the first phase of processing, operations are done in a geometrical coordinate system that is independent of modulator type and geometry. The second phase is adapted to a particular modulator. It produces tiles 510 (FIG. 5) that are pieces of modulator data arranged according to requirements from modulator.

When discussing the datapath, we call the abutting parts of an area, covered by the pattern, "tiles" 510. Tiles can be fully described by geometrical coordinates. We refer to tiles in both the GPM processing and the MPM processing, even though the coordinate systems could be quite different between the two.

Our description of the GPM processing refers to square tiles 510. One should recognize that while rectangular tiles could also be used, especially with a rectangular modulator. Generally, using rectangular tiles would reduce performance, because tiles with long sides will generate more extension zone 515 area. Tiles with long sides are also likely to traverse/cross more cell boundaries than squares tiles thereby creating unnecessary overhead when fetching data To make the tiles independent of each other for parallel processing, we use a guard bound or "halo" around the actual tile. We process data in this halo that influences data inside the tile. This "halo" is called an extension zone and is processed in more or less the same way as the rest of the tile. A large extension zone area surrounding a "true tile" area will create unnecessary overhead. One of the factors that influences the size of the halo is the size of the fractured pattern geometries. From simple geometry, a square will have less extension zone area than any rectangle of the same area. Despite a preference for square tiles, present data path implementation also supports rectangle shaped tiles.

A fundamental issue with extension zones involves creating small tiles to get manageable pieces of data to handle. The extension zone size practically limits the smallest size of a tile. If a tile of the smallest practical size still cannot be processed quickly enough, writing will hit a "hard stop issue". One way to avoid this problem is by balancing HW for processing tiles, interaction range, pattern complexity and pixel size for each application.

Parallel processing is easier to schedule when all tasks processed in parallel are of approximately the same complexity and have approximately the same computation time. Otherwise the processing may suffer from "tailing," i.e., where the entire powerful compute cluster is sitting waiting for one tile to finish. To mitigate this, a dynamic scheme that generates tiles that are similarly complex to process is disclosed.

One implementation of tile-based processing includes actually creating autonomous data files describing individual tiles. This so-called "true tiling" method unfolds hierarchical data. Unfolding the hierarchical data surrenders the advantages of compression and nesting, but the data has to be unfolded further downstream for vector processing and/or rendering, so the burden of unfolding may not be too great.

The second method, so-called "spatial indexing," avoids this early unfold. Creating a spatial index facilitates access to the information needed to compose a particular limited area, such as a tile. Spatial indexing reduces the unfolding problem. Optionally, a slight hidden unfold may be applied where cells to be unfolded cover more than one spatial area. The burden of repeatedly reading unfolded data should be mitigated by caching.

A handful of guidelines will improve file-base processing. First, in a large compute cluster a fixed number of tiles, say 1000, is unlikely to be enough. A modern GPU will have more than 100 processing elements. A thousand tiles would result in allocation of only 10 tasks per processing element. This low number of task produces relatively bad averaging and an increased risk of tailing.

Second, if a spatial large tile fails to complete or in any other way encounters a computational problem, a large area would need to be searched to find the problem. This could be a particularly large area if the input data file organization and hierarchy are not altered and the indexing were strictly cell-based.

Third, it has been observed that the extreme case of placing each geometry in a separate cell, results in a very large index file. In some cases, an index file of 1 GB for a 2-3 GB pattern file was been seen. If the index file were kept resident in memory, such a large index could result in excessive swapping with diminished performance.

Fourth, patterns with large overlapping cells give rise to another problem. When a node processes a tile, it works with data from all cells that overlap the tile. Some data formats allow a pattern to be organized in different cells, even though all cells cover the entire mask. This type of data organization would mean that a processing node would need to read and process the entire pattern for each tile processed! Even if the pattern data were small enough to fit into a node's memory without swapping, I/O exhaustion in the compute cluster could cause overall performance to drop significantly. Ratios between read and produced data for a compute node could be as bad as >1000x.

Some technologies responsive to those issues, which can be used singly or in combinations, are discussed below.

Dynamic tiling—There is no need for a fixed number of tiles created. Tile size can vary depending on pattern complexity. If a tile is deemed too complex to process in a standard time, it can be divided into 4 new tiles. A square tile is easily divided into four smaller squares.

No hard limits for tile sizes—Still, the extension zone size implies a practical lower limit of tile size. Each tile can be processed as a single task with its own logging, scheduling etc. An application can rely on OS mechanisms for caching and the like for subsequent tile processing.

Indexing will re-organize cell structure—During indexing cells could be redefined to have a good relation between data content and spatial extension. Small cells could be collapsed and large cells with high amounts of data divided into smaller cells. A dynamic re-tiling scheme responsive to down-stream exceptions could be implemented.

A data path that is free from, suppresses or supports correction of systematic repetitive small errors would help minimize a condition known as "Mura".

Preferably, original coordinates for geometries that intersect with a tile border can be kept in the data as far downstream in the data path as possible. Rounding to an integer grid at tile borders could risk causing Mura, particularly for slanted off-grid geometries.

Using localized memoryless rendering, without need for pixel to pixel or tile to tile communication is another way to minimize propagating error terms, as happens when the Bresenham algorithm is used. To massive parallelize rendering, it is useful to be able render independent of any communication between neighboring pixels, as well within a tile as in the surrounding tiles. A Bresenham rendering does not fulfill this, due to the error term that is propagated from pixel to pixel. So one way to reduce error propagation is to use true area sampling, which analytically calculates the area coverage of a pixel from all objects/geometries touching that pixel. If objects are non-overlapping and enough numerical precision is used, each feature area coverage can be calculated separately and final result will be the sum of individual contributions. Pixels can be calculated individually and independently. Also, objects can be calculated individually and independently. This is favorable for acceleration in massively parallel implementations, such as those running on modern GPUs.

Introducing pseudo-random dithering, for instance, using a long pseudo-binary sequence in the rounding process from floating-point to integer, can reduce systematic rounding effects.

FIG. 1 depicts generic data path. In addition to the GPM 121 processing domain and MPM 123 processing domain, discussed above, a third data domain warrants discussion. The vector data domain precedes rasterization to create the GPM. Therefore, the three different data domains are vector data, pixel data in a consolidated Geometrical Pixel Map (the GPM) 121 and pixel data organized for the modulator (the MPM 123, Modulator Pixel Map).

Figure 2:
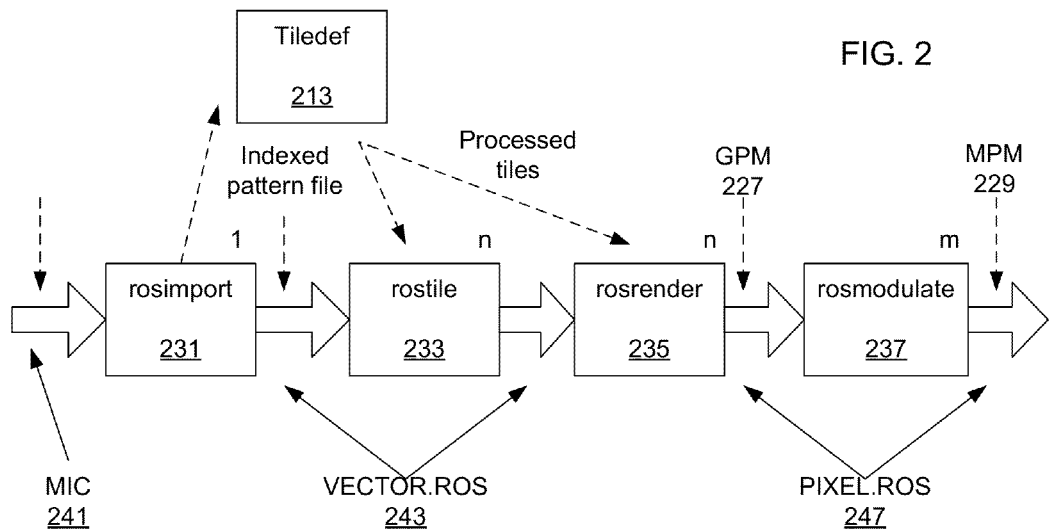
FIG. 2 One functional block implementation of the data path architecture.

FIG. 2 depicts functional block oriented implementation of the architecture using two data formats. For the three domains, two data formats have been defined. The vector data format is defined as VECTOR.ROS 243 and the pixel data format is defined as PIXEL.ROS. The pixel data format is used for both the GPM and the MPM 123. Four data processing functional blocks 231, 233, 235, 237 and one support function 213 are illustrated.

Rosimport 231 handles format conversions.

Rostile 233 handles vector domain geometry processing.

Rosrender 235 handles rendering and pixel domain image processing in the GPM data domain.

Rosmodulate 237 handles modulator dependent output processing and pixel domain image processing performed on the MPM data domain. Application tiledef 213 supports tile definitions in the geometrical domain, vector and GPM.

Interfaces

VECTOR.ROS 243 is the common internal vector type format used for the data path architecture. It is based on a subset of OASIS (P39). Spatial indexing is added by using cell and cell boundary information. Some additional properties are added according to P39 methods for format extension. PIXEL.ROS 247 is the data path pixel format. To enable a hierarchy, which is more convenient for MPM than for GPM the container format HDF5 is used. Tile description 213 could exist as a file or a database and describes the tiles to be processed. Information stored for each tile includes ID, which is a unique identifier used whenever a tile must be uniquely identified, e.g. for logging, progress etc; "lower-left" and "size," which are, two coordinate pairs describing the extent of the tile; extension zone size, which is size of the "halo,"

typically same in x and y; status information about the tile processing state, such as not processed, flat polygon data available, or pixels available; and describing physical properties such as data volume, pattern density.

The tile description also defines the organization and hierarchy of tiles. Same format can be used both for describing tiles in GPM domain and in MPM domain.

Rosimport

Rosimport 231 translates and indexes an input file into a VECTOR.ROS 243 file. One version of rosimport 231 translates a Micronic format file 241 to VECTOR.ROS 243. All pattern operations that can be done by handling geometry vertices individual are also done in rosimport. Examples of such operations include translation, scaling, rotation and mirror. This operation can spool through the entire data set. Parameters to rosimport 231 control the re-structuring of cells to support spatial indexing process.

Rostile

Rostile 233 extracts all data needed to process and generate a tile from the input data file. The processing may include at least the following steps: healing/re-polygonize, overlap removal, Boolean layer operations and sizing. In the course of performing these operations, the data hierarchies are unfolded. Hence, the output data will be one single cell with single geometries. Output can be selected to either be outlined polygons or fractured into renderable geometries.

The outlining/overlap removal process, if solved as an intersection finding algorithm, can require n-squared running time. An enhanced Bentley-Ottman algorithm has been implemented for segment intersection finding, overlap removal, layer operation and sizing, which runs more efficiently.

Several instances of rostile 233 can run in parallel since the processing of a tile is independent from processing any other tile by use of extension zones 515 to create slightly overlapping tiles. For each tile the VECTOR.ROS 243 input file is accessed, especially the spatial indexing information. Good caching increases performance. Preferably the application should not need to manage caching of the indexing or similar information because repeated access requests should find this information residing in operating system caches.

Rostile 233 also calculates pattern density. This calculation can be done on a per segment basis before assembling all segments into geometries.

Rostile 233 can, optionally, identify and tag true corners in outline or fractional geometry and propagate this information downstream for special handling. Since re-entrant polygons may exist, all polygon vertices are not true corners.

Rosrender

The rosrender 235 application reads a tile in VECTOR-.ROS 243 format and generates the corresponding gray scale pixel map approximation of the vector data. Input data is self contained, without any need for giving any other coordinate information. Pixel size and quantization levels are given as parameters. One rendering method is so-called true area sampling using at least 32-bit floating point arithmetic, where area coverage of pixels for each geometry is analytically calculated. Before rendering, if the data is not fractured in the VECTOR.ROS tile, a fracturing from polygons to triangles or trapezoids can be performed. Local coordinates are used. Potential for Mura can be reduced by using 32-bit floating point representation of segment end points in the rendering window which gives a fine enough grid given the rendering window sizes used.

Figure 11:
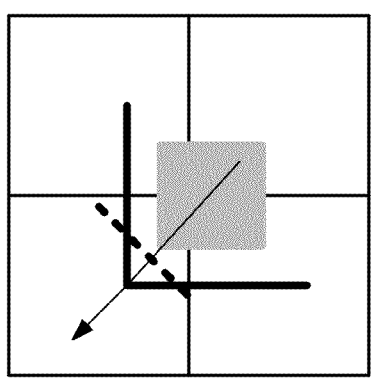
FIGS. 11-12 illustrate how a gradient can be used to handle corners that fall within a grey scaled pixel (FIG. 11) or coincident to the boundary of a grey scaled pixel (FIG. 12).
Figure 12:
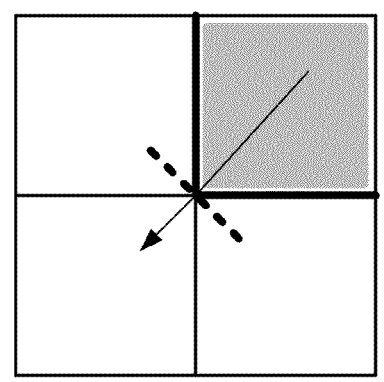

After rendering into pixels, operations that are independent of the exposure system, the substrate or the mask and any morphological operations can be done. During vector conversion gradients are calculated and stored with at least gray pixel values which represent pixels that contain and edge or corner. This gradient is later used in the re-sampling process to enhance resolution. FIGS. 11-12 illustrate how a gradient can be used to handle corners that fall within a grey scaled pixel (FIG. 11) or coincident to the boundary of a grey scaled pixel (FIG. 12). The two figures indicate the grey scaled side of the dark corner by grey shading. The gradient arrow points from the grey scaled pixel towards white pixels, for instance. The dotted pseudo-edge perpendicular to the gradient yields an area representation of the corner that has a different shape but the same area as the corner covered.

A typical resolution ratio between GPM and MPM pixels is in the range of 5-10 GPM pixels per MPM pixel when using gradient information. To achieve same accuracy without gradient information requires at lease twice as much data.

Output from rosrender 235 is a PIXEL.ROS 247 file covering the tile. After rendering, data can be cropped to only cover the tile 510, not the extension zone 515. Extension zone size information is given by information in the VECTOR.ROS data. There can be one PIXEL.ROS file per tile. The PIXEL.ROS format supports hierarchy. Thus it would be an easy task to assemble the tile PIXEL.ROS files into one single file. This would create a large file. An uncompressed GPM could easily be in the excess of 10 TB.

The actual rendering process can be accelerated by using accelerator elements. One example of such accelerator is a graphical processing unit (GPU); another example is a field-programmable gate array (FPGA). A many-core processor or processor bank could also be used. Technology for use of a GPU is described in the attached provisional application no. 61/040,105, entitled "RENDERING FOR LITHOGRAPHY ON GPU HARDWARE", which was filed on Mar. 27, 2008 and is hereby incorporated by reference.

There is a strict aligning between pixels and tiles, where a tile border always coincides with a GPM pixel border.

Rosmodulate

The rosmodulate 237 application reads data from one or more GPM tiles 247 and produces a tile of modulator arranged pixel data. The "tile" here is typically a strip, a stamp or even a micro-sweep for one beam (AOM system) in its finest grid, but could also be the entire pattern. As a user selectable option, the output pixel can be converted to calibrated modulator drive values by using look-up table functions or the output pixels can remain in the spatial domain.

Transformation of pixels from the GPM 227 to the MPM 229 domain can be done by area re-sampling. By coordinate system transformation between an MPM pixel and the GPM pixel map, contribution from each GPM pixel covered by an MPM pixel can be calculated, giving the resulting MPM pixel value.

Figure 3:
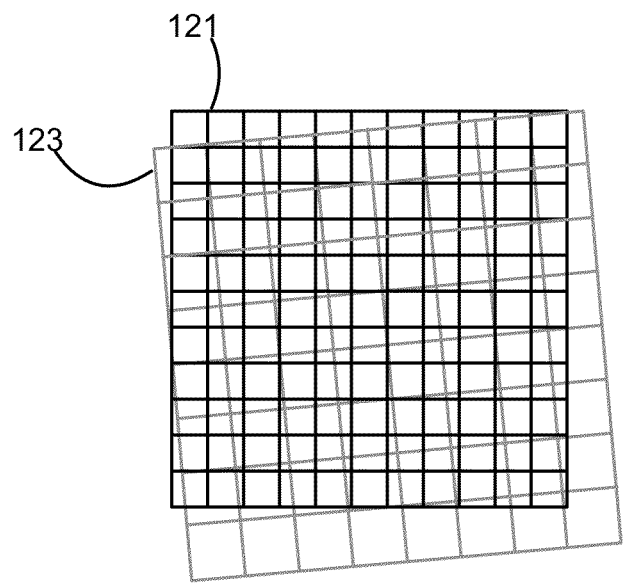
FIG. 3 Original image (black) and the re-sampling grid (red).

FIG. 3 depicts a GPM 121 and MPM 123. In practice, the pixels of the GPM are typically smaller and higher resolution than the MPM pixels. Amplitude values for GMP 121 pixels, denoted by a(n,k), are used to sample the GPM to produce an MPM 123.

Re-sampling can be done by traditional area sampling (AS). The normalized A(i,j) is calculated as the sum of amplitude contribution from pixels in the GPM grid 121 proportional to the area they overlap pixels in the MPM grid 123.

$$A(i, j) = \frac{1}{s_a(i, j)} \sum_n \sum_k a(n, k) \cdot [s_a(i, j) \cap s_a(n, k)]$$

However, to get sufficient accuracy the ratio of GPM to MPM pixels should be large, thus increasing the size of the GPM to be stored.

Figure 4:
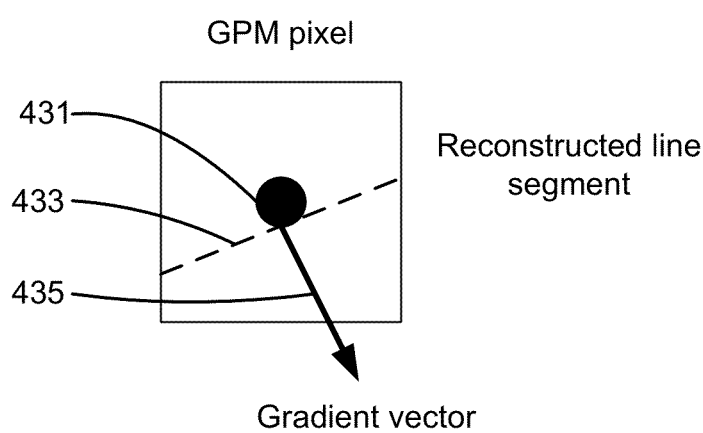
FIG. 4 Reconstructed pattern segment by gradient information.

As depicted by FIG. 4, instead of increasing the resolution the GPM pixels, gradient information can be used to support pixel re-sampling. As a result, a smaller ratio of GPM to MPM pixels can be used. Based on the pixel grey scale value and the pixel gradient, a line segment 433 can be reconstructed through the GPM pixel. This line segment 433 is perpendicular to the gradient 435 and with a position proportional to the grey scale value. The area covered in the GPM 121 pixel equals the grey scale value. This reconstructed pattern line is then clipped using the MPM 123 pixel as a clipping mask and the area coverage of the MPM 123 pixel is calculated.

Tiledef

The tiledef 213 application administrates the geometrical tiling definition information. It also handles re-tiling of tiles 510 where down stream exceptions have occurred. When called first time with an "empty" tile definition file, tiledef creates a first assumption tiling based on additional pattern description parameters, e.g. density.

Rosmodulate Examples

In the rosmodulate 237 re-sampling process, compensations in addition to those stemming from how the modulator traverses the pattern can be introduced. One application would be alignment of a pattern to a substrate/mask. In rosmodulate, any affine transform (translation, scale, rotation) could be applied. For direct write applications, where same pattern is printed on several substrate each having slightly different scale and rotation. In general, re-sampling from the GPM allows the same GPM to can be used for multiple substrate that each require a different re-sampling.

Morphological operations could be applied in this step. The most common used morphological operation is bias between sizing along orthogonal axes.

Below are two examples of modulators that can be used and transforms between GPM and MPM.

AOM Modulator Scheme

Figure 5:
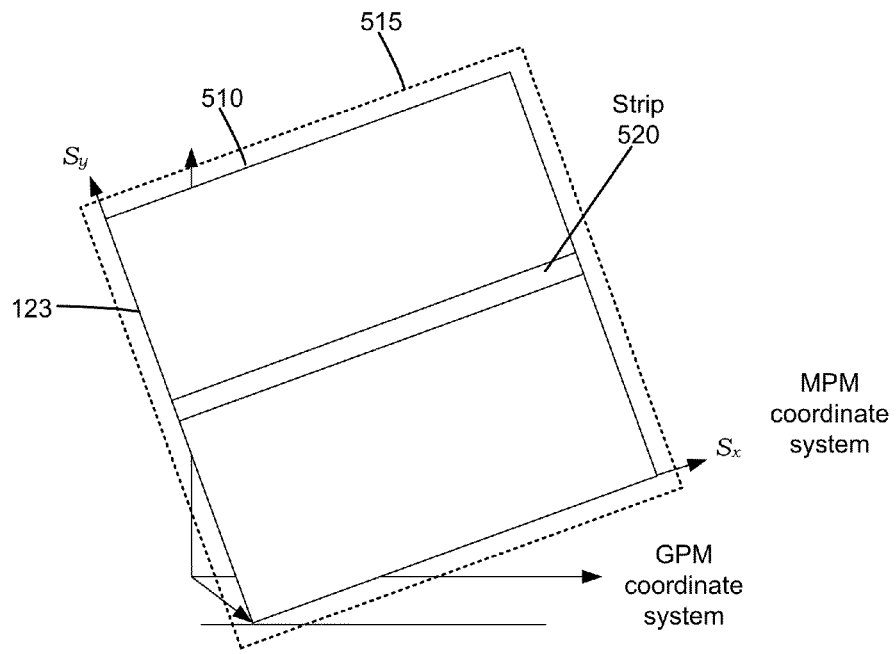
FIG. 5 Global coordinate transformations between GPM and MPM.

Suppose that a GPM exists and is going to be printed. Conversion between GPM grey pixels and MPM grey pixels is done by re-sampling (e.g., using area sampling.) One way to accomplish this conversion, involves finding GPM pixels that overlap with an MPM pixel. This relation is found through several steps of parameter controlled coordinate transformations. On a global level, a number of transformations between the GPM and MPM are defined (FIG. 5). The transformation includes translation (x-x', y-y'), rotation (α), scale ($s_{x'}$, $S_{y'}$) and orthogonality correction, when the axes are not perpendicular (when we cannot assume Sx'⊥Sy') For orthogonality correction, we can introduce γ=Sx' ∡ Sy'. Preferably, these corrections can be expressed parametrically, to reduce storage requirements. Otherwise, they can be represented in a generalized distortion grid that uses vectors to express the differences between true and distorted grids.

Figure 6:
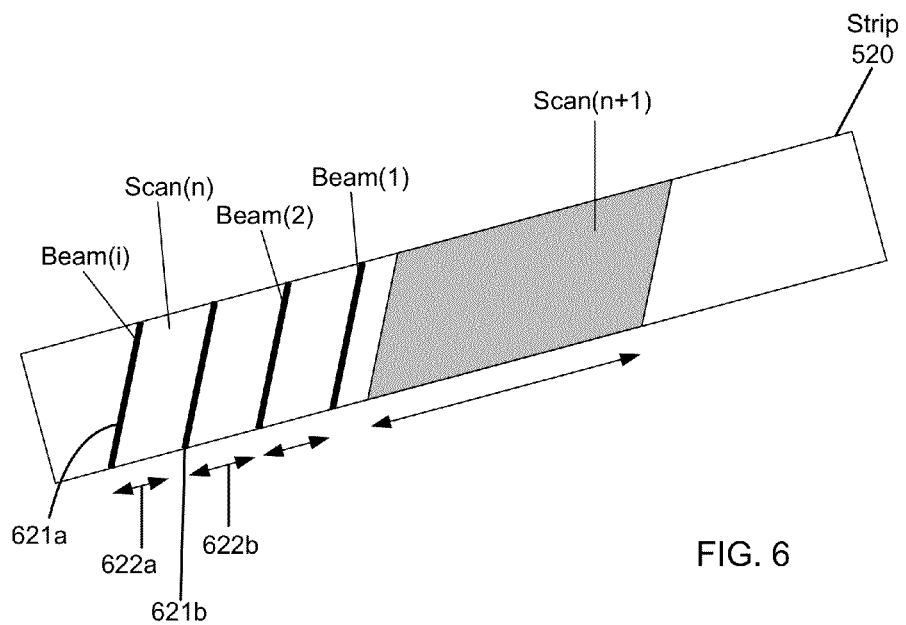
FIG. 6 Strip local coordinate transformations between GPM and MPM.

FIG. 6 depicts the strip 520 level, where a number of new transformation parameters emerge. A number of beams (621a and 621b)are depicted each with a different separation, $b_{i-1,i}$ (622a and 622b). Also azimuth compensation, β, is included in the re-sampling transformation. The azimuth angle could be made as an individual parameter per beam, like the beam separation $b_{i-1,i}$. By making the azimuth compensation during the re-sampling (GPM to MPM conversion), bi-directional printing is enabled since the azimuth angle is different while printing on a return stroke.

Figure 7:
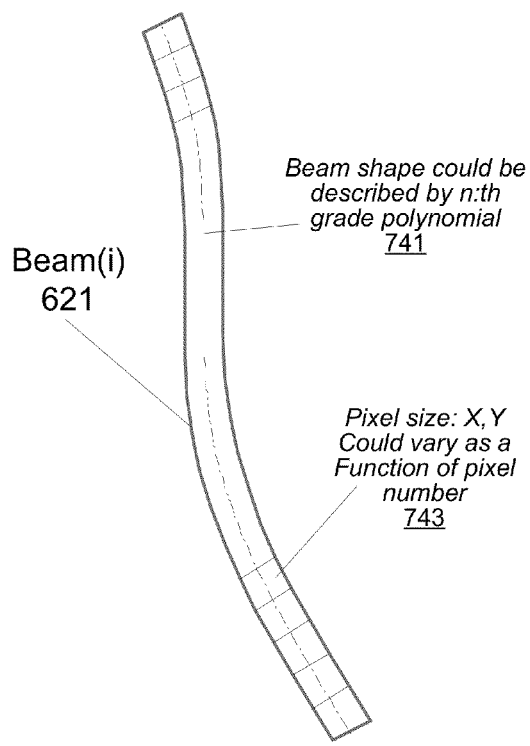
FIG. 7 Beam local coordinate transformations between GPM and MPM.

FIG. 7 depicts the next level in the transformation hierarchy—at the beam and individual pixels. The shape of the beam (621) is defined and the modulator is pixel size. In the general case the beam trajectory could be described as an $n^{th}$ degree polynomial (741). The pixel size (743) is normally the same along the beam trajectory but there is nothing fundamental in the concept preventing the pixel size to vary along the beam trajectory. This could be used e.g. in cases where beams do not fully cover the printed area, leaving small gaps. A compensation for this would be to use a pixel position versus size relation and making gap pixels larger in the MPM re-sampling process.

One consideration to be made when deciding to have a complex transformation process between GPM and MPM is computational effort versus performance. Using this scheme to full extent would require a full MPM pixel coordinate calculation for each pixel re-sampled, which substantial increases needed number of operations for the re-sampling.

DMD Modulation Scheme

Figure 8:
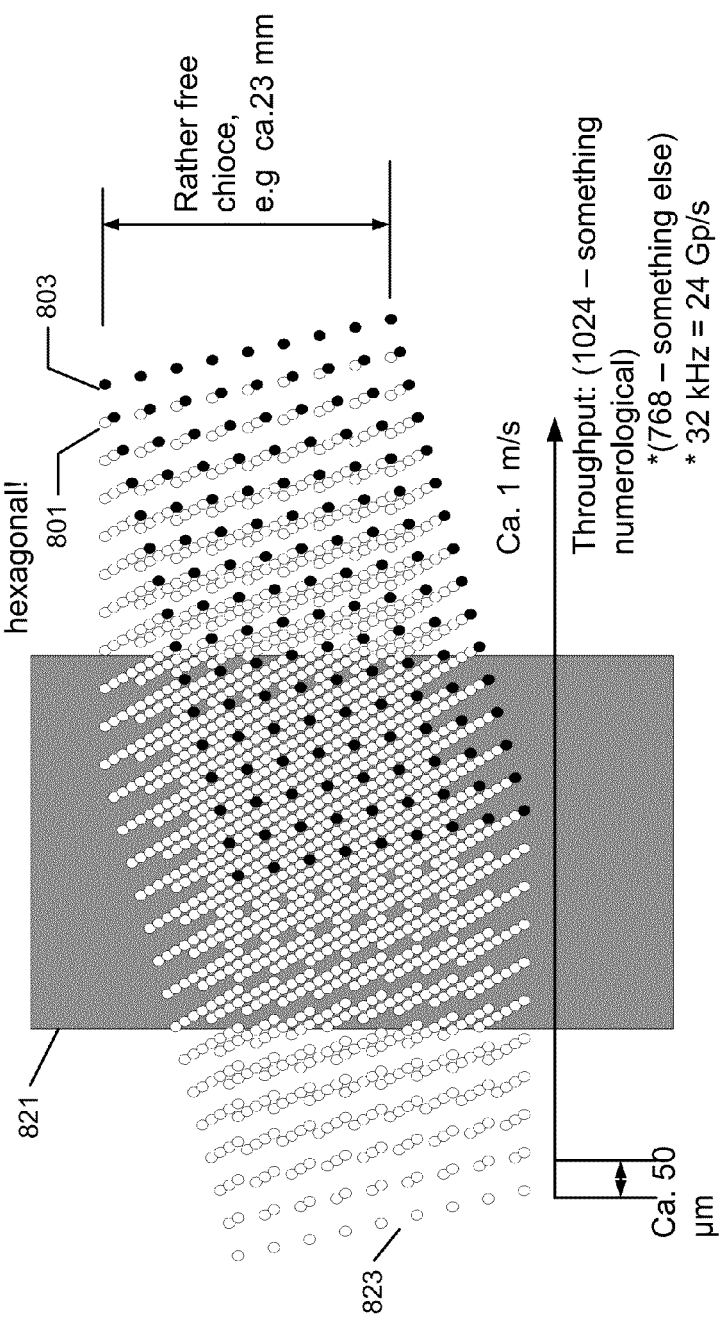
FIG. 8 DMD writing principle.

The writing principle for a DMD based writing engine is quite different from the traditional amplitude modulated scanning Gaussian spot method used in the AOM writers. FIG. 8 illustrates a tilted (relative to a so-called Manhattan feature 821) Gaussian sparse spot matrix printed using a high PRF laser.

The spots 823 are "binary", on or off (801, 803), but many spots are interstitially printed and spots can be overstruck by a second spot in the same location. Two adjacent spots on plate may come from very different parts of the DMD, hence giving an averaging over field.

From a data path view regarding the rosmodulate transformation this does not have to be so different. Regard each spot as square pixel, then the entire spot matrix printed in one flash could be regarded as a "stamp". One difference from an SLM stamp is that pixels are not adjacent but tilted. The tilt was already introduced in the AOM example above, and since coordinates can be calculated for each pixel individually before re-sampling there is nothing fundamental requiring an adjacent pixel grid. So basically the same re-sampling algorithm can be used.

Since the pixel is binary ("two grey scale values, black/white") a threshold algorithm, i.e. how to determine when a pixel shall be on or off, during re-sampling, is needed. The resulting grey value for the re-sampled MPM pixel should be threshold. In the simplest way this could be a constant threshold model, but could also be a varying threshold model. This VT model could be "morphological dependent" (pattern dependent), i.e. depending on pattern, surrounding GPM pixels, gradient field etc., the threshold level is changed.

Since the DMD pixel rate is high, there could be an issue regarding performance using a full grey scale value re-sampling. Another scheme could then be to use the re-constructed GPM line segment 433 from the gradient 435 and determine if the DMD pixel is outside or inside that line.

Figure 9:
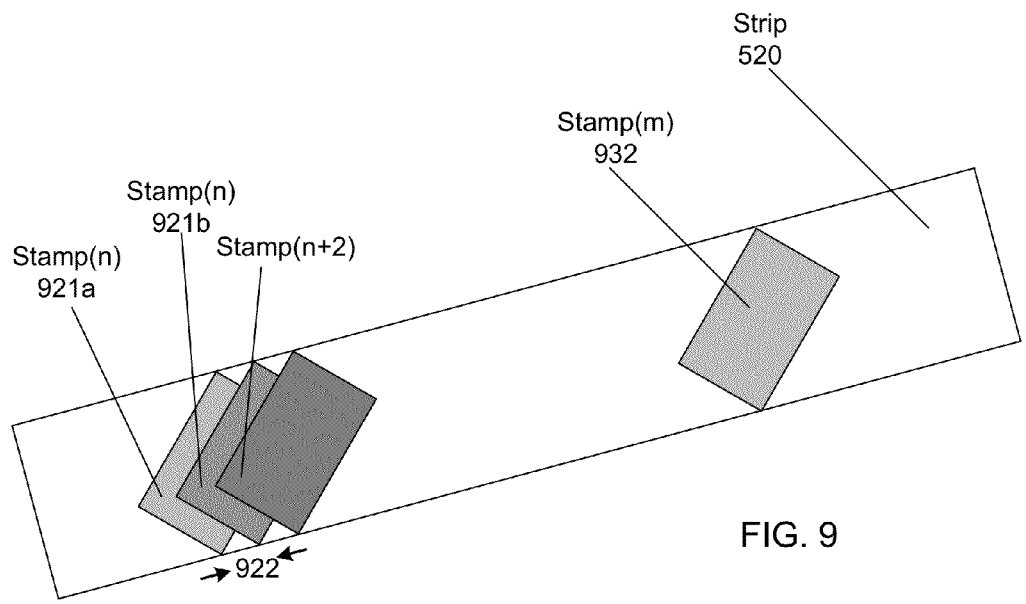
FIG. 9 Strip arrangement for DMD writing principle.

In FIG. 9, the same global transformations apply as in FIG. 5 but for the strip decomposition. The strip 520 is composed of slightly tilted (β) (921a, 921b) stamps with a pitch (Ps) (922) much less than the stamp size (932).

Figure 10:
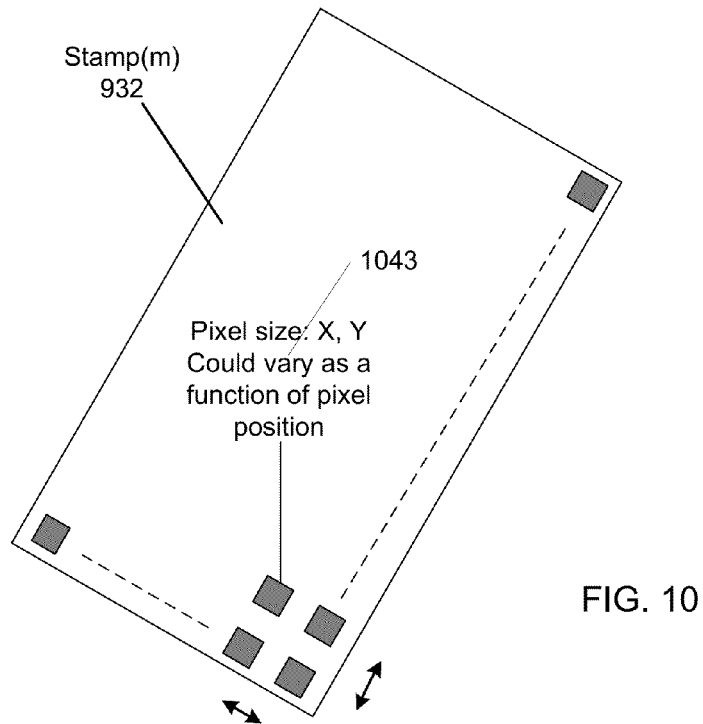
FIG. 10 Spot/Pixel arrangement in a stamp for DMD writing principle.

FIG. 10 discloses a sparse array of K×M pixels with size X, Y within the stamp, and with a pitch of PPx and PPy. A constant pitch and pixel size have been depicted (1043) but they could of course be parameterized to be dependent on stamp position.

The re-sampling principle allows the MPM 123 pixel to not be just rectangular or square, also circles could be used. However the computational effort to calculate the resulting pixel value increases. Other shapes, such as hexagonal can be considered.

Data Integrity

Data integrity is a real world concern. A data path that generates an error on a plate without warning is undesirable. With respect to the vast amount of data handled by a data path, errors will likely occur even when best error rate figures are diminishingly low. It is desirable to have mechanisms that detect such errors.

Three classes of Pattern integrity can be defined: "Data path HW reliability"—errors which might occur due to imperfections in processing elements, data storage or transportation links. Data path SW reliability" is defined by pattern errors caused by "mishaps" in the transformation process, either in the pattern transformation algorithm or in the actual implementation. These errors are repeatable for the same set of input condition, e.g. a rendering error. "Data path operator reliability" is defined as errors caused by pure "human factor" such as unclear description of side effects to certain pattern control commands.

Data Path HW Reliability

Given the vast amount of data processed error free operation cannot be guaranteed. At best there is a small error rate. If the number of detected errors is small, the numbers of undetected errors will, if the design has been made correctly, be magnitudes less. So by keeping track of detected and corrected error intensity, the undetected error intensity rate can be predicted and assessed. This error detection is usefully addressed by built in functionality.

Errors can occur basically in three domains First they occur during calculation/transformation in a "processing element", second, during data transport or third, during data storage. The two latter phenomena are protected by either error correction coding or error detection coding. The data storage protection is achieved by introducing checksums at all applicable block levels in payload data. This is provided for in the VECTOR.ROS and PIXEL.ROS formats. To be effective, this protection data is generated/calculated at close proximity to where the payload data is generated and stored. That is, a checksum is generated in the same function that generates the pixels. The first domain of errors is generally harder to detect. One way to detect calculation errors is to have a number of systems operating in parallel on the same set of input data realizing the same functionality but with separate implementation. Output data from the different systems are then weighted and the output result with highest probability to be correct is selected. This scheme is generally not recommended in a cost sensitive data path. Instead the scheme disclosed involves interleaving in time and/or over HW.

Compute tasks are divided into "tiles" and a "tile" is computed as an autonomous task in a node. A task could then be calculated repeated times on the same node. This saves the effort to move data to another node and can detect random errors that occurred during calculation/transformation, by comparing the results (e.g. checksums) from consecutive runs. However this scheme does not detect if any HW failure causes the data to be produced have a persistent error. A task could be calculated on different nodes. One or more other nodes could re-calculate the same task and the task management function could compare results (e.g. checksums) and selected the most likely correct one as the task to be used. This method should detect node HW that starts to generate faulty data. In a heterogeneous cluster, where the same revision of HW is not used in every node, this method could also be used for regression testing to find computational differences between different HW that shows up only for certain pattern data combinations. Any combination of these methods can be used.

Process Monitoring Information (PMI) is another set of data that can be used for data integrity checking PMI also acts as a type of checksum or "fingerprint" on data produced. However in difference to actual checksums the PMI data is not used as error detection codes, but merely as an "identification" of data produced. Since PMI data does not need to have error detection capability it can be made more compact and can be stored for long time. This enables a mask house to re-process a later by customer rejected mask to see if the same "fingerprint" is generated.

TECHNICAL FIELD OF THE INVENTION

The technology disclosed may be implemented in a system for scanning a workpiece or a substrate, e.g. a large flat substrate, for reading or writing patterns or images. Examples are flat panel displays, Printed Circuit Boards (PCBs), substrates or workpieces for packaging applications and photovoltaic panels. Reading and writing is to be understood in a broad sense. For instance, reading may mean microscopy, inspection, metrology, spectroscopy, interferometry, scatterometry, etc. of a large workpiece. Writing may mean exposing a photoresist, annealing by optical heating, ablating, or creating any other change to the surface by an optical beam. Thus, the different embodiments may be implemented in a pattern generator for writing an image on a substrate, e.g. a pattern generator comprising one or a plurality of image-generating modulators. The measurement and/or inspection tool where the embodiments may comprise one or a plurality of detectors, sensors, e.g. Time Delay and Integration (TDI) sensors, or cameras such as e.g. Charged Coupled Devices (CCDs). The technology disclosed may also be implemented in a pattern generator for writing patterns on a thick substrate such as a three-dimensional (3D) substrate or may be implemented in a tool for measuring or inspection of a thick workpiece or substrate, e.g. a tool for measuring or inspecting a three-dimensional (3D) pattern in a photoresist thicker than 2 μm up to 100 μm or even thicker. The technology disclosed may also be implemented in a scanning multi-beam system such as an acousto-optic multi-beam system comprising at least one deflector.

According to some particular embodiments, the technology disclosed is implemented in a reading or writing system, e.g. a measurement tool or a pattern generator, comprising one or a plurality of arms, e.g. 2, 3, 4, 5, 6 or even more arms and where each arm may comprise an optical system for writing or reading a pattern or an image. The reading/writing head of an arm may be stationary or essentially stationary and the optical image is translated by a rotating or swinging optical system from a position near the axis of rotation to a position further away from it. The rotating optical system may be simple and light, e.g. consisting only of two parallel mirrors, and therefore scan a circle on the workpiece. The rotating optical system may also comprise one or a few lenses, e.g. a final lens for each arm, and/or prisms, e.g. a dove prism. The workpiece may be moveable (at least with a relative motion to the center of rotation of the optics), e.g. continuously or in steps, so that the scanning optics can reach all parts of the workpiece. Thus, there may be no or essentially no relative motion between the mirror(s) or optical system, e.g. including a final lens, positioned at the end of the arm and the position for writing/reading the pattern/image on the workpiece/substrate. According to some embodiments of the technology disclosed, the control system knows from the actuators driving the motions or from position and/or angle encoders which part of the workpiece is being written to/read from. For writing the controller controls the sending of the intended data to be written to the addressed area, and for reading the read image or data is recorded or analyzed with awareness of where it came from. One property of the technology disclosed would then be that the optics can be designed not to rotate the image during the rotation of the optics. Therefore it is possible to create a contiguous pixel map representing the optical image in the controller, either before it is written or after it has been read. The technology disclosed may use the fact that a circular motion is easier to control than a linear one. Bearings, e.g. fluid bearings; define the center of rotation accurately. If the rotating part is made as a wheel with balancing masses around the center of rotation and given a continuous rotational moment, the only energy needed for the canning is the one needed to compensate for the losses in the bearing. The rotor (the rotating optics with its mechanical support used in some embodiments), may be completely passive and all active parts such as motors, cooling, sensors etc may be placed in the stationary mechanics.

According to some other embodiments, the technology disclosed may be implemented in a reading or writing system, e.g. a measurement tool or a pattern generator, having a stage that may advance the workpiece in one direction and the head may be scanning in a perpendicular direction. Systems having a stationary workpiece and an x-y-moveable scanning head or a stationary head and an x-y-moveable stage may also be used. The technology disclosed may also be used in a system where the x-y stage does all the movement.

Some Particular Embodiments

The present invention may be practiced as a method or device adapted to practice the method. The invention may be an article of manufacture such as media including computer instructions to carry out computer-assisted re-sampling of data for microlithography or computer readable storage media including computer instructions that, when combined with hardware, create one of the devices disclosed herein.

One embodiment is a method of producing intermediate pixels that can be resampled to produce printable pixels. This intermediate pixel technology is an alternative to relying solely on smaller pixels to increase resolution. The intermediate technology uses pixels produced from rasterizing vector data. For instance, the vector data may be stored in hierarchical representation formats such as OASIS™ or GDSII. The vector data may be fragmented. This method includes storing intermediate pixels produced from rasterized vector data as white, black and grey scale pixels. A raster processor may be used to calculate the intermediate pixels from vector data. The coding data for stored pixels may use flags or merely different grey scale values to distinguish among pixel types. For instance, white and black pixels may have grey scale values at opposite full scale values. For at least some of the grey scale pixels, this method includes calculating from the vector data and storing in memory edge geometric data that defines edge placement within the grey scale pixels. A gradient processor cooperating with the raster processor may be used for the calculating. Storing the edge placement can be used to enhance accuracy, to reduce storage required for a particular resolution, or to enhance accuracy while managing storage requirements. Morphological operations such as biasing or resizing a pattern can be more accurately carried out using gradients derived from vector data than using gradients derived by applying convolutions or other operators to neighborhoods of grey scaled data, as described in the prior U.S. Pat. No. 7,302,111, entitled GRAPHICS ENGINE FOR HIGH PRECISION LITHOGRAPHY, filed 12 Sep. 2001. The traditional" difference kernels, e.g., Sobel, Prewitt, and Harris, will introduce some degree of low pass filtering since they operate over a neighborhood surrounding of the pixel of interest.

The method may be extended to producing printable pixels by resampling the intermediate pixels using the edge geometry data. A resampling processor can carry out the resampling. Printable pixels can be mapped to a linear writing sweep, as in U.S. Pat. No. 7,302,111. Alternatively, printable pixels can be mapped to a curved writing sweep, as described in the contemporaneously filed U.S. patent application Ser. No. 12/631,653, entitled "METHOD AND DEVICE USING ROTATING PRINTING ARM TO PROJECT OR VIEW IMAGE ACROSS A WORKPIECE". In either case, the printable pixels can be placed on a distorted grid, for instance a grid describing a large workpiece that has been distorted by one or more patterning operations.

Practicing one aspect of this method, the information that defines edge placement within the grey scale pixel includes a gradient that, when combined with a grey scale value of the grey scale pixel, allows estimation of an edge position and angle.

A gradient also can be used to represent a corner that falls within an intermediate pixel.

In some implementations, the intermediate pixels further distinguish between grey scale pixels that represent an edge and those that represent a corner. In other implementations, no distinction is required.

The corner can be represented by an edge placement that defines an area of the pixel equal to the corner's area. A variety of gradient calculations can be used to calculate the gradient of either an edge or corner. These gradient calculations can use multiple pixels. When a gradient is calculated for a pixel that contains a corner, two or more adjoining pixels can be used to enhance the gradient calculation.

Edge geometric data, such as a gradient or a segment with ordered end points or a line with dark and light sides, also can be useful for white or black pixels when a pattern edge or corner is coincident with a pixel edge. This is useful for morphological operations, even when it is otherwise unnecessary for resampling.

Optionally, in combination with the method and any of its aspects, implementations or features, one can use the intermediate pixels, without regeneration, for resampling to produce printable pixels in multiple printing passes on a particular workpiece, the multiple printing passes using pixel grids offset from one another. And/or, one can use the intermediate pixels, without regeneration, for multiple workpieces that require varying transforms to compensate for differences between the workpieces.

The intermediate pixel representation may require about 5 to 10 times as much storage of as the printable pixels, while providing at least 64 times the resolution of the printable pixels when storing a pattern for a two-dimensional microlithographic pattern of a chip.

Another method disclosed is a method of preparing an intermediate pixel representation from rasterized vector data. This method can be practiced on its own or in combination with preceding method and any aspects, implementations or features of the method. This method includes supplementing hierarchically represented design data elements using a processor to create spatial index data elements that that identify parts of a two dimensional area represented by the elements of the hierarchically represented design data elements. For a particular area within a tile, this method continues with selecting relevant hierarchically represented design data elements using the spatial index data elements and unfolding the selected hierarchically represented design data elements. The unfolded hierarchically represented design data elements are processed to produce white, black and grey scale pixels, which are stored as intermediate pixels.

This method may further include deriving the spatial index information from cell and cell boundary information and stored at a design cell level.

One aspect of this method and its extensions is that the method may further include using a data language format extension to store the spatial index data elements.

Practicing this method, its extensions, aspects, features and embodiments may further include parallel processing of multiple tiles to produce the intermediate pixel representation, each one of the multiple tiles processed by respective processors in a set of processors.

The processors named to carry out the various aspects of these methods can be of many different architectures. Two particularly useful, current architectures include field programmable gate arrays (FPGAs) and graphical processing units (GPUs), both of which can support many parallel operations. Other gate arrays, signal processors, CPUs, ASICs and processor architectures generally can be the underlying hardware that performs the identified operations.

The method embodiments have corresponding devices. One device produces intermediate pixels that can be resampled to produce printable pixels. The intermediate technology uses pixels produced by a raster processor from vector data. For instance, the vector data may be stored in hierarchical representation formats such as OASIS™ or GDSII. The vector data may be fragmented. This device includes memory, in which the intermediate pixels produced from rasterized vector data are stored as white, black and grey scale pixels. The coding data stored for the intermediate pixels may use flags or merely different grey scale values to distinguish among pixel types. For instance, white and black pixels may have grey scale values at opposite full scale values. A gradient processor cooperating with the raster processor calculates edge geometric data from the vector data that defines edge placement within the grey scale pixels for at least some of the grey scale pixels. The gradient processor stores in memory the edge geometric data. Storing the edge placement can be used as described above in the context of the methods.

The device further may include a resampling processor that produces printable pixels by resampling the intermediate pixels using the edge geometry data. Printable pixels can be output to memory or directly to a modulator. Printable pixels can be mapped to a linear writing sweep, as in U.S. Pat. No. 7,302,111. Alternatively, printable pixels can be mapped to a curved writing sweep, as described in the contemporaneously filed U.S. patent application Ser. No. 12/631,653, entitled "METHOD AND DEVICE USING ROTATING PRINTING ARM TO PROJECT OR VIEW IMAGE ACROSS A WORKPIECE". In either case, the printable pixels can be placed on a distorted grid, for instance a grid describing a large workpiece that has been distorted by one or more patterning operations.

The edge geometric data generated by the gradient processor may include a gradient that, when combined with a grey scale value of the grey scale pixel, allows estimation of an edge position and angle. Alternatively, the edge geometric data may be a segment with ordered end points or a line with dark and light sides. As described above, supplemental information further defining a grey scaled pixel can be useful for white or black pixels when a pattern edge or corner is coincident with a pixel edge. This is useful for morphological operations, even when it is otherwise unnecessary for resampling.

The gradient process also can represent a corner that falls within an intermediate pixel by a gradient or the alternative segment or line mentioned above. In some implementations, the intermediate pixels further distinguish between grey scale pixels that represent an edge and those that represent a corner. In other implementations, no distinction is required. The corner can be represented by an edge placement that defines an area of the pixel equal to the corner's area. A variety of gradient calculations can be used to calculate the gradient of either an edge or corner. These gradient calculations can use multiple pixels. When a gradient is calculated for a pixel that contains a corner, two or more adjoining pixels can be used by the gradient processor to enhance the gradient calculation.

Optionally, the resampling processor can use the intermediate pixels, without regeneration, for resampling to produce printable pixels in multiple printing passes on a particular workpiece, the multiple printing passes using pixel grids offset from one another. And/or, the resampling processor can use the intermediate pixels, without regeneration, for multiple workpieces that require varying transforms to compensate for differences between the workpieces.

Another device is a spatial indexing processor. This device can be practiced on its own or in combination with preceding device and any aspects, implementations or features of the device. This spatial indexing processor supplements hierarchically represented design data elements and creates spatial index data elements that that identify parts of a two dimensional area represented by the elements of the hierarchical design data. For a particular area within a tile, the raster processor and gradient processor cooperate with the indexing processor to select relevant hierarchically represented design data elements and unfold the selected hierarchical design data. The unfolded design data is processed to produce white, black and grey scale pixels, which are stored as intermediate pixels.

This spatial indexing processor may derive the spatial index information from cell and cell boundary information and stored at a design cell level.

The indexing processor and its extensions may further use a data language format extension to store the spatial index data elements.

Practicing this device, its extensions, aspects, features and embodiments may further include parallel processors working on multiple tiles to produce the intermediate pixel representations, each one of the multiple tiles processed by respective processors in a set of processors.

We claim as follows:

1. A method of creating a second pixel map using a first pixel map, the method including:
   receiving the first pixel map including a plurality of white, black and grey scale pixels and gradient directions for one or more of the grey scale pixels;
   using said gradient directions and grey scale values for generating edge geometry data for one or more of the grey scale pixels; and
   resampling the first pixel map to produce the second pixel map using the edge geometry data and the plurality of white, black and grey scale pixels of the first pixel map.

2. The method of claim 1, wherein a value for a pixel of the second pixel map is generated using a plurality of pixels of the first pixel map and the edge geometry data associated with at least one of the plurality of pixels of the first pixel map.

3. The method of claim 1, wherein the first pixel map represents a pattern including edges between white and black areas and gradient directions correspond to the edges of the pattern passing through the grey scale pixels of the first pixel map.

4. The method of claim 1, wherein the edge geometry data is stored in a separate channel from coding data that identifies the plurality of pixels of the first pixel map as white, black and grey scale.

5. The method of claim 1, wherein a reference to the edge geometry data is stored with coding data that identifies the pixels of the first pixel map as white, black and grey scale.

6. The method of claim 1, wherein the first pixel map does not include gradient directions associated with black or white pixels.

7. The method of claim 1, wherein resampling includes combining a grey scale value of a grey scale pixel of the first pixel map with an associated gradient direction representing an edge to estimate an edge position and angle in the second pixel map.

8. The method of claim 1, wherein resampling includes combining a grey scale value of a grey scale pixel with an associated gradient direction representing a corner to estimate a corner placement in the second pixel map.

9. The method of claim 8, wherein the grey scale value of the grey scale pixel with the associated gradient direction representing the corner corresponds to the area of the corner within the pixel of the first pixel map.

10. The method of claim 1, wherein edge geometry data of the first pixel map includes an indication distinguishing between grey scale pixels representing an edge and grey scale pixels representing a corner.

11. The method of claim 1, the first pixel map further including edge geometry for at least one black or white pixel, wherein a printable pattern has an edge placement coincident with an edge of the black or white pixel of the first pixel map.

12. The method of claim 1, wherein the first pixel map requires 5 to 10 times as much storage as the second pixel map, while providing at least 64 times the resolution of second pixel map when storing a pattern for a two-dimensional microlithographic pattern.

13. The method of claim 1, wherein first and second pixel maps are pixel grids; and wherein during resampling the pixels of the first pixel map pixel grid are not aligned with the pixels of the second pixel map pixel grid.

14. The method of claim 13, wherein during resampling an axis of the first pixel map pixel grid is perpendicular or parallel to an axis of the second pixel map pixel grid.

15. The method of claim 13, wherein during resampling an axis of the first pixel map pixel grid is not perpendicular nor parallel to an axis of the second pixel map pixel grid.

16. The method of claim 13, wherein during resampling a plurality of first pixel map pixels overlap a single second pixel map pixel.

\* \* \* \* \*